United States Patent [19]
Sun

[11] Patent Number: 6,052,399
[45] Date of Patent: Apr. 18, 2000

[54] INDEPENDENTLY ADDRESSABLE LASER ARRAY WITH NATIVE OXIDE FOR OPTICAL CONFINEMENT AND ELECTRICAL ISOLATION

[75] Inventor: Decai Sun, Sunnyvale, Calif.

[73] Assignee: Xerox Corporation, Stamford, Conn.

[21] Appl. No.: 08/924,030

[22] Filed: Aug. 29, 1997

[51] Int. Cl.$^7$ .................................................. H01S 3/085
[52] U.S. Cl. ............................................. 372/50; 372/46
[58] Field of Search ........................................ 372/50, 46

[56] References Cited

U.S. PATENT DOCUMENTS

| | | | |
|---|---|---|---|
| 5,262,360 | 11/1993 | Holonyak, Jr. et al. | 437/237 |
| 5,327,448 | 7/1994 | Holonyak, Jr. et al. | 372/94 |
| 5,684,819 | 11/1997 | Zirngibl | 372/50 |
| 5,729,563 | 3/1998 | Wang et al. | 372/50 |
| 5,742,631 | 4/1998 | Paoli | 372/50 |

OTHER PUBLICATIONS

Cheng et al., "Lasing Characteristics of High–Performance Narrow–Stripe InGaAs–GaAs Quantum Well Lasers Confined by AlAs Native Oxide", *IEEE Photonics Technology Letters*, vol. 8, No. 2, Feb. 1996, pp. 176–178.

Carraci et al., "High–performance planar native–oxide buried–mesa index–guided AlGaAs–GaAs quantum well heterostructure lasers", *Appl. Phys. Lett.*, vol. 61 (3), Jul. 20, 1992, pp. 321–323.

*Primary Examiner*—James W. Davie
*Attorney, Agent, or Firm*—William Propp

[57] ABSTRACT

The present invention provides a high density, edge emitting laser array structure formed by a wet oxidation process. Native oxide layers formed in adjacent grooves in the p-cladding layer Al-based alloy of the laser array structure provide both optical confinement to achieve single transverse mode operation and for electrical isolation to allow each laser diode to be independently addressable.

8 Claims, 4 Drawing Sheets

INDEPENDENTLY ADDRESSABLE LASER ARRAY WITH NATIVE OXIDE FOR OPTICAL CONFINEMENT AND ELECTRICAL ISOLATION

BACKGROUND OF THE INVENTION

This invention relates to a monolithic semiconductor laser arraya more particularly, to an independently addressable, high density, laser array using a native oxide layer for optical confinement and electrical isolation.

Monolithic arrays of solid state semiconductor lasers are very desirable light sources for high speed laser printing, optical fiber communications and other applications. A common laser structure is a so-called "edge emitting laser" where light is emitted from the edge of a monolithic structure of semiconductor layers.

A ridge waveguide can form the lateral optical confinement structure for the semiconductor laser and thus the ridge precisely defines the origin of the edge emission of light from the semiconductor laser. A ridge waveguide is typically a small ridge of semiconductor material with a generally flat upper surface and sloped sidewalls on top of the active semiconductor layer in a semiconductor laser structure.

Index guiding refers to the use of variations in the optical index of refraction between semiconductor layers of different materials to provide for a waveguide to optically confine the emission of light from one of the semiconductor layers.

Generally, formation of native oxides in a laser is an important step to achieving good electrical and optical confinement in the structure. One approach in oxide formation is commonly known as the "surface-oxidation" technique. Examples of such an approach are described in U.S. Pat. No. 5,327,448 entitled "Semiconductor Devices and Techniques For Controlled Optical Confinement" and U.S. Pat. No. 5,262,360 entitled "AlGaAs Native Oxide," both of which were invented by Holonyak et al.

As discussed in these patents, under the "surface-oxidation" approach, a cap GaAs layer is placed above a thick AlGaAs layer with a high aluminum content, which is deposited above the active layer of a laser structure. Under this "surface-oxidation" approach, the surface of the sample is first patterned with silicon nitride, protecting and exposing parts of the GaAs cap layer. The exposed GaAs areas are then removed by chemical etching exposing the surface of the underlying AlGaAs layer which has a high aluminum content. The sample is then oxidized in water vapor where the oxidation in the AlGaAs layer proceeds downwards from the surface until it reaches the active layer which has a lower aluminum content. Since the active layer has a lower aluminum content, the oxidation process essentially stops when it reaches the active layer, providing electrical and optical confinement to the laser structure.

Another approach towards forming oxides is a so-called "buried-layer" oxidation approach which is described in "Lasing Characteristics of High-Performance Narrow Stripe InGaAs-GaAs Quantum-Well Lasers Confined by AlAs Native Oxide," IEEE Photonics Technology Letters, Vol. 8, No. 2, p. 176 (February 1996) by Cheng et al. Under this approach, an AlAs layer is placed above and below the active layer of a laser structure. Then, grooves are etched, forming an exposed stripe mesa structure between the grooves. As a result of the etching, the AlAs layers sandwiching the active layer are exposed along the sidewalls of the mesa. During an oxidation process, these AlAs layers are oxidized laterally from the sidewalls of the mesa inwards towards the center of the mesa. However, other layers in the structure remain essentially unoxidized since their aluminum content is lower. The oxidized AlAs layers reduce the effective refractive index of the regions both above and underneath them, providing lateral electrical and optical confinement to the sandwiched active layer. Another discussion regarding the "buried-layer" technique is described in "High-Performance Planar Native-Oxide Buried-Mesa Index-Guided AlGaAs-GaAs Quantum Well Heterostructure Lasers," Appl. Phys. Lett. vol. 61 (3), p. 321 (July 1992) by Smith et al.

The key disadvantage of the "buried-layer" approach is the difficulty in controlling the amount of oxidation. Because the oxidation rate of AlAs or AlGaAs with a high aluminum content depends upon aluminum composition and process variations, any variation in aluminum composition or process parameters will be reflected by changes in the oxidation rate, which in turn creates uncertainty in the amount of oxidation. The process is relatively temperature-sensitive. Therefore, when such a technique is applied to forming lasers, the devices typically have manufacturability and yield problems.

With laser arrays, it is desirable to position the laser elements as densely as possible. However, closely spaced elements are difficult to electrically connect and to cool through heatsinking. Furthermore, closely spaced laser elements tend to interact electrically, optically and/or thermally. These interactions, called "crosstalk", are usually undesirable.

Individually, lasers are low power output devices. Arrays of lasers can be used to increase the power output and to simplify optical system design. To provide and maintain good optical alignment of the laser elements of the array with one another and to minimize the assembly involved, arrays have been fabricated so that the laser elements are in a single monolithic semiconductor structure.

Another problem is making each individual laser element in the array independently addressable. As the laser elements are spaced closer together in higher densities, it is progressively more difficult to separately, individually and independently cause each element to emit light.

Accordingly, there is a need for developing a monolithic, independently addressable laser array with accurately defined and controlled oxide regions which provide electrical and optical confinement.

SUMMARY OF THE INVENTION

The present invention provides a high density, edge emitting laser array structure formed by a wet oxidation process. Native oxide layers formed in adjacent grooves in the p-cladding layer Al-based alloy of the laser array structure provide both optical confinement to achieve single transverse mode operation and for electrical isolation to allow each laser diode to be independently addresssable.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1:
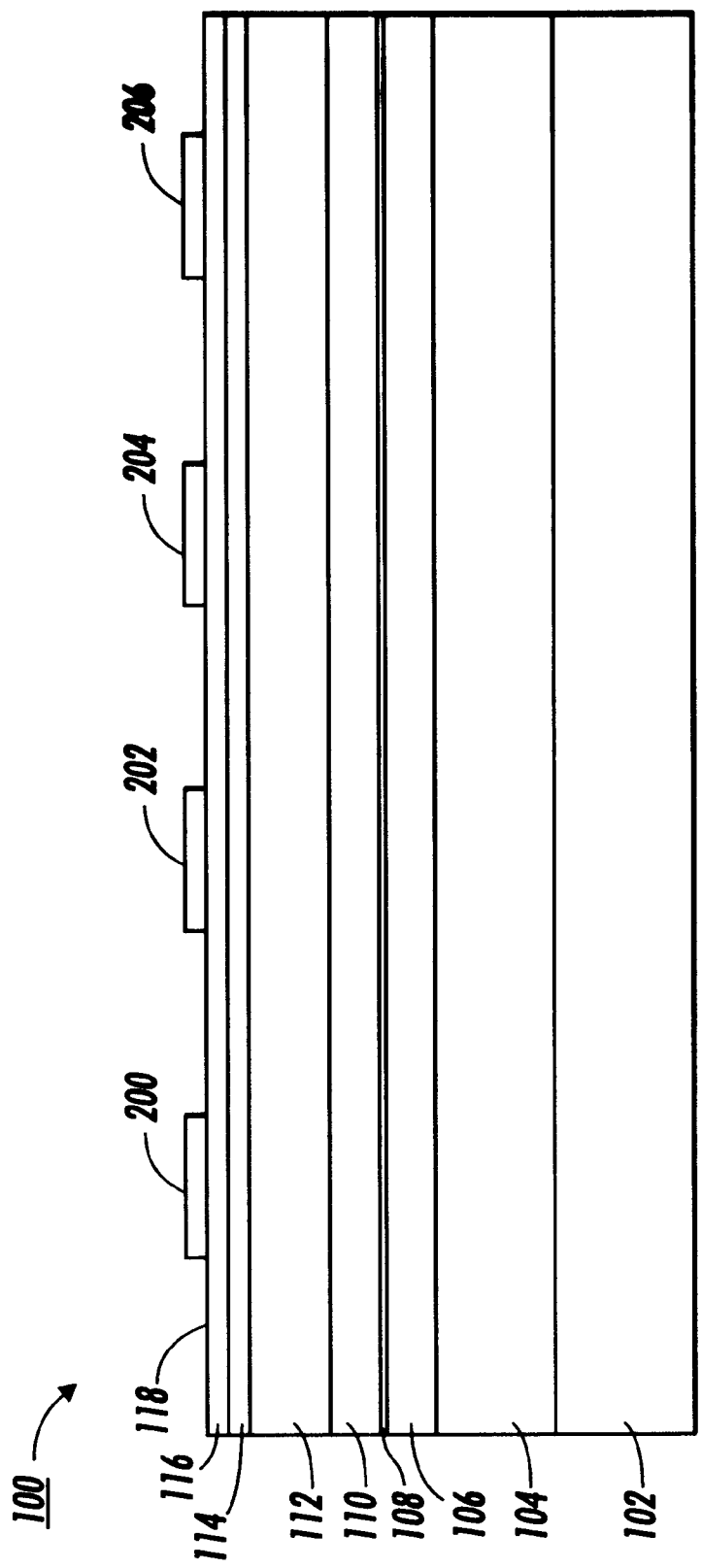
FIG. 1 is a side view of the semiconductor layers of the edge emitting laser array structure other present invention.

FIG. 1 illustrates an independently addressable, high density semiconductor laser structure 100 fabricated by wet oxidation of the upper cladding layer to form optical waveguides and electrical isolation for electrical interconnect in accordance to the present invention. As shown in FIG. 1, an n-type $Al_{0.5}In_{0.5}P$ lower cladding layer 104 is grown on an n-type GaAs substrate 102 using a well-known epitaxial deposition process commonly referred to as metal-organic chemical vapor deposition (MOCVD). Other deposition processes such as liquid phase epitaxy (LPE), molecular beam epitaxy (MBE), or other known crystal growth processes can also be used. The aluminum mole fraction and doping level of the lower cladding layer 104 range from 25 to 50 percent and 1 to $5 \times 10^{18}$ $cm^{-3}$ respectively. The thickness of the AlInP cladding layer 104 is approximately one micron ($\mu$m). The doping level of the n-type GaAs substrate 102 is approximately $5 \times 10^{18}$ $cm^{-3}$ or higher. Although not illustrated, a buffer layer may be deposited prior to the deposition of the lower cladding layer 104 in the event that lower throughputs are acceptable.

Above these layers is an undoped $(Al_{0.6}Ga_{0.4})_{0.5}In_{0.5}P$ lower confinement layer 106, which has an aluminum content of about 30% and a thickness of about 120 nanometers. After this lower confinement layer 106 has been deposited, a $Ga_{0.4}In_{0.6}P$ active layer 108 is deposited, which should result in a light emission at 670 nanometers. The active layer 108 may be a single quantum well, a multiple quantum well, or a layer with thickness greater than that of a quantum well. The thickness of a quantum well typically ranges from five to twenty nanometers. Above the active layer 108 is an undoped $(Al_{0.6}Ga0.4)_{0.5}In_{0.5}P$ upper confinement layer 110. The aluminum content of this confinement layer 110 is typically 30% and a thickness of about 120 nanometers. The lower and upper confinement layers, 106 and 110, together with the active layer 106, generally produce a laser structure with a lower threshold current and a smaller optical divergence.

After the upper confinement layer 110 has been formed, a p-type $Al_{0.5}In_{0.5}P$ upper cladding layer 112 of about one micron is deposited. Typically, this cladding layer 112 has an aluminum content of 50% and a magnesium doping level of $5 \times 10^{18}$ $cm^{-3}$. Upon the upper p-type $Al_{0.5}In_{0.5}P$ cladding layer 112 is a $Ga_{0.5}In_{0.5}P$ layer 114, which typically has a thickness of 50 nanometers, and a magnesium doping level of approximately $5 \times 10^{18}$ $cm^{-3}$. This GaInP layer 114, along with a p+-GaAs cap layer 116 deposited on the GabiP layer 114, facilitate the formation of ohmic contacts to the laser structure. The p+-GaAs cap layer 116 is typically 100 nanometers with a magnesium doping of $1 \times 10^{19}$ $cm^{-3}$.

After all the semiconductor layers of the semiconductor structure 100 shown in FIG. 1 have been deposited, silicon nitride stripes 200, 202, 204 and 206 are formed on the upper surface 118 of the semiconductor structure by a photolithographic process. The four silicon nitride stripes 200, 202, 204 and 206 are 4 microns wide and spaced 50 microns apart and run lengthwise down the surface 118 of the semiconductor structure.

Figure 2:
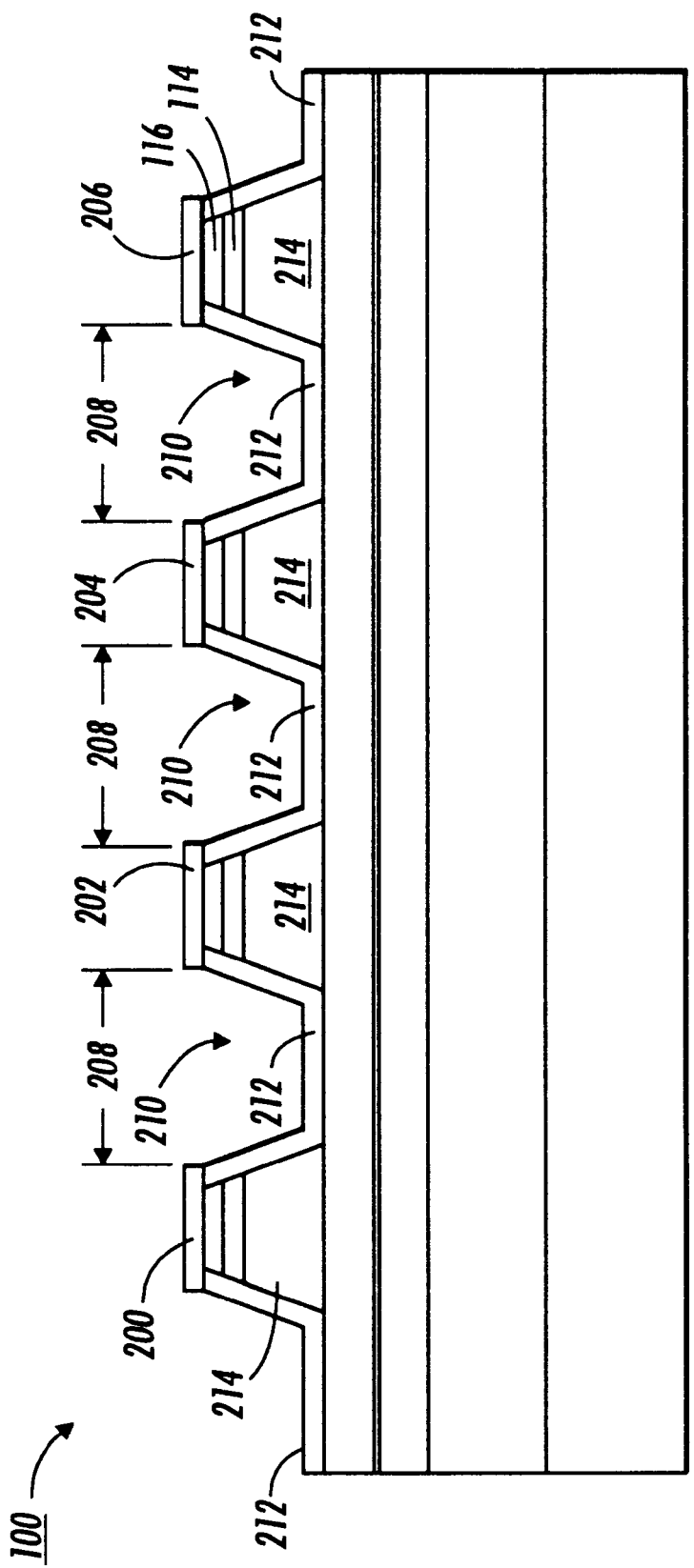
FIG. 2 is a side view of the semiconductor layers of the edge emitting laser array structure of the present invention after etching and wet oxidation.

As shown in FIG. 2, the semiconductor structure 100 is etched in the areas 208 between the stripes 200, 202, 204 and 206 to form grooves 210 between the silicon nitride stripes. The grooves are etched by a process such as reactive ion etching or wet etching which provides for the formation of a deep depression with angled sidewalls. The grooves 210 are etched through the GaAs cap layer 116, through the GainP layer 114, and partially through the $Al_{0.5}In_{0.5}P$ upper cladding layer 112 to a depth of 800 nanometers.

After the formation of the grooves with the silicon nitride stripes 200, 202, 204 and 206 remaining on the surface, the semiconductor structure 100 undergoes a wet oxidation step. The structure is typically oxidized with water vapor in a nitrogen environment at elevated temperatures, in excess of 530° C. for approximately 4 hours. During the oxidation process, the remaining upper cladding layer 112 shown in FIG. 2 is exposed to the ambient through the grooves 210. Thus, the upper cladding layer 112, which comprises of AlInP with a high aluminum content, is oxidized radially outwards from each of the grooves into a native oxide layer 212 which is approximately 300 nanometers thick.

During the oxidation process, other layers in the structure remain essentially unoxidized since their aluminum content is lower and the layers are not exposed to the water vapor except for the sidewalls of the p-GaInP and GaAs contact layers. The portion of the AlInP layer 214 under the silicon nitride stripes which remains unoxidized controls the current path through the active layer 108.

The native oxide regions 212 improve the current confinement ability of the laser structure. The boundaries of regions 212 are defined by the AlGaInP layer upper confinement layer 110 in the direction parallel to the surface of the substrate and by the silicon nitride stripes 200, 202, 204 and 206 and the unoxidized portion of the AlINP layer 214 under the silicon nitride stripes in the direction perpendicular to the surface of the substrate. In addition, these boundaries are relatively smooth and sharp as they are defined by an epitaxial growth process and a photolithography process. The spacing between the oxide regions 212 are controlled by using a photolithography mask and etch process. Since the photolithography process has a high degree of accuracy, the spacing between the oxide regions 212 can be minimal. Also, since these oxidized regions are defined after the epitaxial process has been completed, this approach allows for a high degree of process flexibility. In this case, the spacing between the lateral waveguides are closely spaced and tightly controlled. Consequently, highly compact laser structures are formed.

Figure 3:
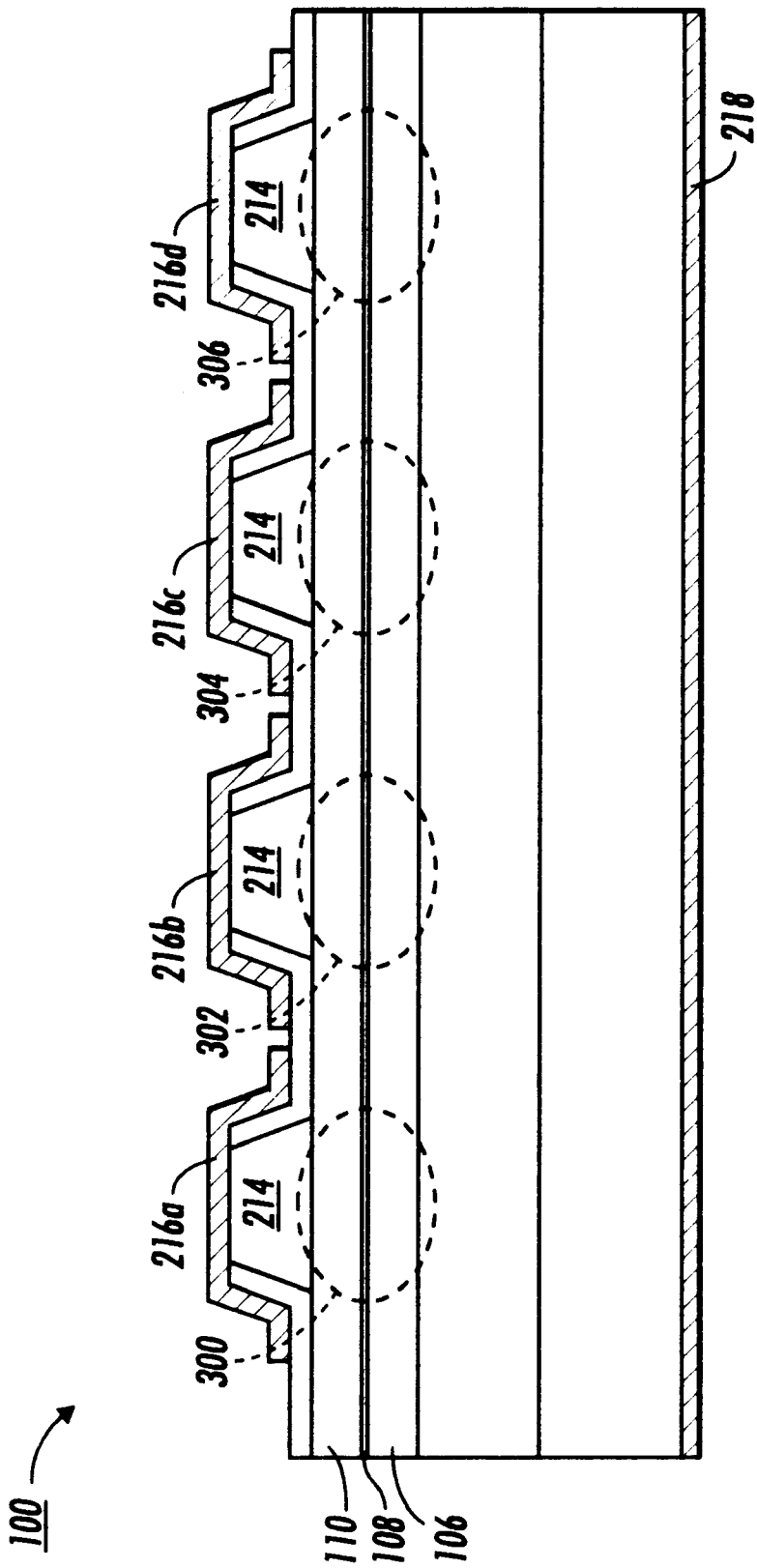
FIG. 3 is a side view of the quad-spot edge emitting laser array structure of the present invention.

After the oxidation process, the silicon nitride stripes 200, 202, 204 and 206 are removed and metal contacts 216 and 218 are formed on the surface and the bottom side of the substrate respectively for biasing the laser, as shown in FIG. 3. The upper electrode 216 can cover just the contact layers 114 and 116 or, as shown in the FIG. 3, extend down the ridge to partially cover the electrically insulating native oxide layer 212. A typical material used for forming the contacts is a titanium/gold bilayer film.

The resulting semiconductor laser array structure 100 in FIG. 3 is a quad-spot red laser with four laser elements 300, 302, 304 and 306. Each laser element has a 500 $\mu$M long cavity, extending lengthwise in the semiconductor structure 100, and are coated with a high reflection dielectric mirror stack (R>95%) on the rear facet (not shown) and a passivation layer (R~25%) on the front or emission facet (also not shown).

The four laser elements 300, 302, 304 and 306 share a common bottom or n-electrode 218 and have separate, independently addressable, upper or p-electrodes 216a, 216b, 216c and 216d, respectively. Each laser element contains an undoped $(Al_{0.6}Ga_{0.4})_{0.5}In_{0.5}P$ lower confinement layer 106, a $Ga_{0.4}In_{0.6}P$ active layer 108, and an undoped $(Al_{0.6}Ga_{0.4})_{0.5}In_{0.5}P$ upper confinement layer 110 for light emission through the front facet edge of the laser structure.

The unoxidized portion of the AlInP upper cladding layer 214 under the electrode 216 between the adjacent native oxide layers 212 forms a real index-confined ridge waveguide for the light emission for the laser element since the index of refraction of the native oxide is around 1.6 while the index of refraction of the AliNP is typically over 3.0. The lateral waveguide 214, bounded by the native oxide layers 212, optically confines the emitted light. The differences in indices of refraction provide a strong optical confinement of the light emitted by the active region by the ridge waveguide.

Figure 4:
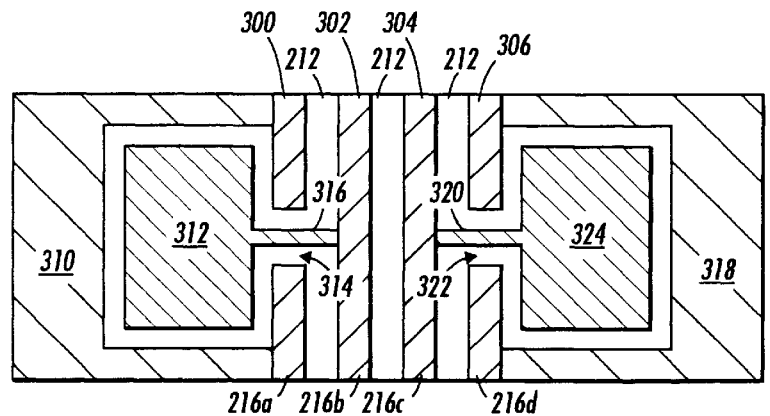
FIG. 4 is a top view of the electrode pattern for independently addressing four laser elements of the edge emitting laser array of the present invention.

Because of the high density of laser elements and close spacing of the elements in the monolithic semiconductor structure, electrical contacts to the inner stripe laser elements 302 and 304 require special patterning, as illustrated in FIG. 4.

The outer stripe electrode 216a is directly connected to its contact pad 310.

To facilitate electrical interconnect from a contact pad 312 to the inner stripe electrode 216b, a narrow window 314 is opened across the outer stripe electrode 216a to allow the exposed surface in the window region to oxidize as well. The window is not metallized like the electrode but rather is the native oxide layer 212 and is formed in the photolithographic masking and etching process. The window 314 enables the metal interconnect electrode 316 for the inner stripe electrode 216b to run across the outer stripe electrode 216a to a large contact pad 312. The opening 314 across the outer stripe electrode 216a is 10 µm wide. By contrast, the laser cavity in this embodiment is 500 µm long. The contact pads 310 and 312 are on the same side of the stripe electrodes, outside the outer electrode 216a.

The window opening 314 across the outer stripe electrode 216a does not affect the emission operation of the underlying laser element 300.

Similarly, the other outer stripe electrode 216d in this quad-spot laser is directly connected to its contact pad 318. The other inner stripe electrode 216c has an interconnect electrode 320 extending through a window 322 in the outer stripe electrode 216d to connect to its contact pad 324. The contact pads 318 and 324 are on the same side of the stripe electrodes, outside the outer electrode 216d.

The use of windows and interconnect electrodes for the inner stripe electrodes with contact pads on the outside of the electrode stripes permits a high density of laser elements which are still independently addressable.

The quad-spot red lasers of the present invention show excellent performance. All four laser elements have uniform threshold current (~17 mA) and differential quantum efficiency (>40 percent/facet). The wavelength separation among the stripe laser elements is less than 10 A, indicating great uniformity. Far field measurement shows that the laser elements operate in single transverse mode.

The native oxide layers of $AlO_x$ provide good heat dissipation. The native oxide layers have excellent thermal conductance of 30 W/km, which is five times better than the AlUNP of the cladding layer and waveguide and twice higher than that of GaAs cap layer. Since the laser elements have low threshold and high efficiency, the thermal crosstalk among the diodes are expected to be small.

A dual-spot red laser in 50 µm lateral spacing of the present invention showed a cross-talk of 1.2% at 5 mW/each and 1% at 10 mW/each power level. The native oxide layers serve to thermally isolate the individual laser elements despite their high density within the monolithic structure.

The thermal crosstalks were only 1.3% for the 25 µm separations of a red native oxide confined quadspot laser and 1.5% for the 15 µm separations of a dual red native oxide confined laser with modulation levels from 0 (just below threshold) to 10 mW. The crosstalk is much lower in comparison to the dual spot buried ridge red laser by etch and regrowth, which is normally around 4 to 5% even at 50 µm separation.

There are several advantages to using the wet oxidation technique for the fabrication of monolithic laser arrays. First, wet oxidation will replace the etching and regrowth approach used for defining buried ridge devices, leading to higher yield and better diode performance. Second, it is easy to make electrical interconnects to the inner stripes, which eliminates ion-implantation needed for electrical isolation. Third, it is possible to design device layout beyond quadspot lasers such as hexa-spot and octa-spot lasers.

Figure 5:
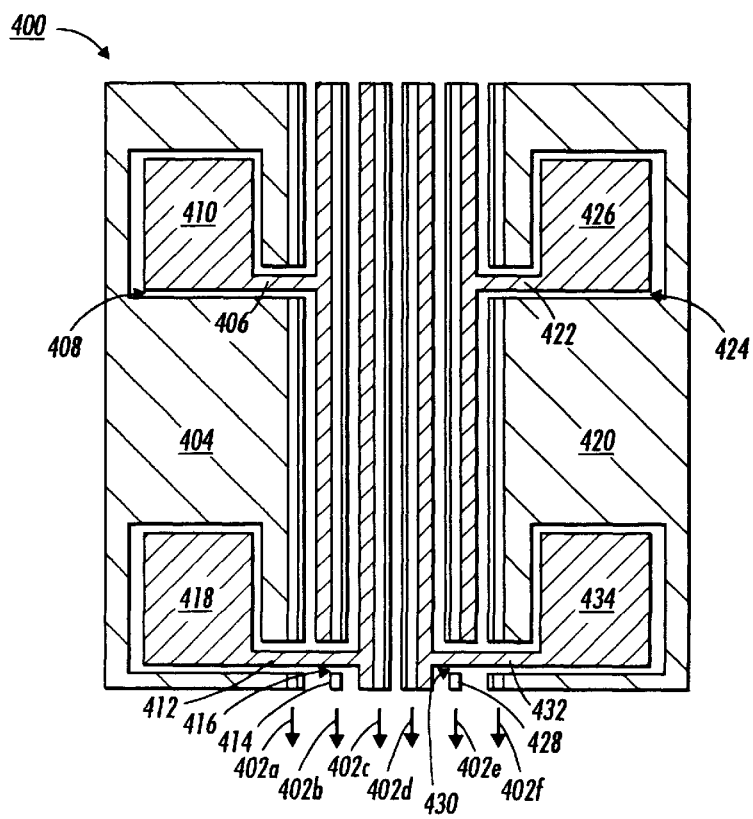
FIG. 5 is a top view of the electrode pattern for independently addressing six laser elements of the edge emitting laser array of the present invention.

FIG. 5 shows a hexa-spot laser structure 400 with the native oxide (AlOx) for optical confinement and electrical isolation of the six laser elements. Similar to the approach used for the quad-spot laser 100 with its four laser elements, native oxide windows across the outer stripe electrodes are used for electrical interconnects.

Thus, the laser structure has six stripe electrodes 402a, 402b, 402c, 402d, 402e and 402f. The outer stripe electrode 402a is directly connected to its contact pad 404. The inner stripe electrode 402b has an interconnect electrode 406 extending through a window 408 in the outer stripe electrode 402a to connect to its contact pad 410. The innermost stripe electrode 402c has an interconnect electrode 412 extending through a first window 414 in the inner stripe electrode 402b, extending through a second window 416 in the outer stripe electrode 402a to connect to its contact pad 418. The two window openings 408 and 416 across the outer stripe electrode 402a does not affect the emission operation of the underlying laser element of the outer stripe electrode 402a. The contact pads 404, 410 and 418 are on the same side of the stripe electrodes, outside the outer electrode 402a.

Similarly, the outer stripe electrode 402f is directly connected to its contact pad 420. The inner stripe electrode 402e has an interconnect electrode 422 extending through a window 424 in the outer stripe electrode 402f to connect to its contact pad 426. The innermost stripe electrode 402d has an interconnect electrode 428 extending through a first window 430 in the inner stripe electrode 402e, extending through a second window 432 in the outer stripe electrode 402f to connect to its contact pad 434. The two window openings 424 and 432 across the outer stripe electrode 402f does not affect the emission operation of the underlying laser element of the outer stripe electrode 402f. The contact pads 420, 426 and 434 are on the same side of the stripe electrodes, outside the outer electrode 402f. The use of windows and interconnect electrodes for the inner stripe electrodes with contact pads on the outside of the electrode stripes permits a high density of laser elements which are still independently addressable.

For multispot lasers, $Al_xGa_{1-x}As$ alloy is normally used as the cladding layer. Since $Al_xGa_{1-x}As$ (x>0.6) can be converted into $AlO_x$ native oxide at a temperature below 500° C. easily, this technique should apply to IR lasers also.

Native oxide index-guided $InGaP-(Al_xGa_{1-x})_{0.5}In_{0.5}P$ quantum well visible lasers show improved operation characteristics with lower threshold currents and higher quantum efficiencies as compared to the conventional buried ridge visible lasers fabricated by etching and regrowth. The threshold current is 18 mA and the differential quantum efficiency is over 66% under pulsed operation and 62% under CW operation for the quad-spot red laser of the present invention. In comparison, buried ridge waveguide lasers fabricated by etching and regrowth from the same structure show a typical threshold current over 30 mA and a differential quantum efficiency of 40%. The lower threshold of the oxide confined waveguide laser of the present invention indicates lower laser cavity loss.

The composition, dopants, doping levels, and dimensions given above are exemplary only, and variations in these parameters are permissible. Additionally, other layers in addition to the ones shown in the figures may also be included. Variations in experimental conditions such as temperature and time are also permitted. Lastly, instead of GaAs and GaAlAs, other semiconductor materials such as GaAlSb, InAlGaP, or other aluminum-containing III–V alloys may also be used.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

I claim:

1. A monolithic array of edge emitting lasers on a common substrate, each of said edge emitting lasers comprising:

a first plurality of semiconductor layers formed on said common substrate;

an active region for emitting light formed on said first plurality of semiconductor layers, said active region having one or more semiconductor layers;

a second plurality of semiconductor layers formed on said active region;

grooves formed in said second plurality of semiconductor layers, native oxide layers formed in said grooves, a ridge waveguide defined by said native oxide layers in said grooves, said ridge waveguide providing optical confinement for light emission from said active region;

said native oxide layers also providing electrical isolation for adjacent edge emitting lasers in said array and first and second electrodes which enable biasing of said active region causing said active region to emit light.

2. The monolithic array of edge emitting lasers of claim 1 wherein said native oxide layers comprise a native oxide of an aluminum-containing semiconductor material.

3. The monolithic array of edge emitting lasers of claim 1 wherein said first plurality of semiconductor layers comprises a Group III–V phosphide material and wherein said second plurality of semiconductor layers comprises a Group III–V phosphide material.

4. The monolithic array of edge emitting lasers of claim 1 wherein said first electrode includes multiple stripe electrodes extending along the upper surface of said second plurality of semiconductor layers and each stripe electrode having a corresponding contact pad.

5. The monolithic array of edge emitting lasers of claim 4 wherein a plurality of said multiple stripe electrodes have a window exposing a native oxide layer allowing an interconnect electrode to connect another stripe electrode to its corresponding contact pad.

6. The monolithic array of edge emitting lasers of claim 4 wherein said array comprises two edge emitting lasers.

7. The monolithic array of edge emitting lasers of claim 5 wherein said array comprises four edge emitting lasers.

8. The monolithic array of edge emitting lasers of claim 5 wherein said array comprises six edge emitting lasers.

* * * * *

UNITED STATES PATENT AND TRADEMARK OFFICE
CERTIFICATE OF CORRECTION

PATENT NO. : 6,052,399　　　　　　　　　　　　　　　　　　　Page 1 of 1
APPLICATION NO. : 08/924030
DATED : April 18, 2000
INVENTOR(S) : Decai Sun It is certified that error appears in the above-identified patent and that said Letters Patent is hereby corrected as shown below:

Column 1 line 5, insert as a new paragraph:

This invention was made with Government support under Agreement No. 70NANB2H1241 awarded by the Department of Commerce. The Government has certain rights in this invention.

Signed and Sealed this

Twenty-fifth Day of July, 2006

JON W. DUDAS
*Director of the United States Patent and Trademark Office*